(12) United States Patent
Ahn

(10) Patent No.: US 7,532,269 B2
(45) Date of Patent: May 12, 2009

(54) LIQUID CRYSTAL DISPLAYS

(75) Inventor: Soon-il Ahn, Cheonan-si (KR)

(73) Assignee: Sansung Electronics, Co., Ltd., Gyeonggi-do (KR)

( * ) Notice: Subject to any disclaimer, the term of this patent is extended or adjusted under 35 U.S.C. 154(b) by 224 days.

(21) Appl. No.: 11/726,984

(22) Filed: Mar. 23, 2007

(65) Prior Publication Data
US 2008/0024689 A1   Jan. 31, 2008

(30) Foreign Application Priority Data
Jul. 28, 2006   (KR) ...................... 10-2006-0071762

(51) Int. Cl.
*G02F 1/1343* (2006.01)
(52) U.S. Cl. ........................ 349/43; 349/144
(58) Field of Classification Search ................ 349/43, 349/144
See application file for complete search history.

(56) References Cited

U.S. PATENT DOCUMENTS

| 5,101,288 A | * | 3/1992 | Ohta et al. ................. 349/144 |
| 5,132,819 A | * | 7/1992 | Noriyama et al. ............. 349/55 |
| 7,301,597 B2 | * | 11/2007 | Jeong et al. ................. 349/144 |

FOREIGN PATENT DOCUMENTS

KR   10-2005-0016834   2/2005

OTHER PUBLICATIONS

Korean Patent Abstracts, Publication No. 1020050016834, Feb. 21, 2005, 1 p.

* cited by examiner

*Primary Examiner*—Richard H Kim
(74) *Attorney, Agent, or Firm*—Haynes and Boone, LLP

(57) ABSTRACT

An LCD having an enhanced light transmittance and improved lateral visibility includes gate and storage electrode lines formed on a first insulating substrate, a data line insulated from and crossing the gate line, a first source electrode partially overlapping an nth gate line and connected to the data line, first and second drain electrodes partially overlapping the nth gate line and separated from the first source electrode, a first sub-pixel electrode electrically connected to a first drain electrode, a second sub-pixel electrode electrically connected to a second drain electrode, a second source electrode partially overlapping an (n+1)th gate line and electrically connected to the second sub-pixel electrode, and a third drain electrode partially overlapping the (n+1)th gate line and separated from the second source electrode and operable to boost a charge voltage of the first sub-pixel electrode and to drop a charge voltage of the second sub-pixel electrode.

13 Claims, 5 Drawing Sheets

LIQUID CRYSTAL DISPLAYS

RELATED APPLICATIONS

This application claims priority of Korean Patent Application No. 10-2006-0071762, filed Jul. 28, 2006, the entire disclosure of which is incorporated herein by reference.

BACKGROUND

This disclosure relates to liquid crystal displays (LCDs), and more particularly, to LCDs having an enhanced light transmittance and improved lateral visibility.

LCDs are one of the more widely used types of flat panel displays, and typically include two substrates, or panels, having a plurality of field-generating electrodes, including pixel electrodes and a common electrode, arranged thereon, with a layer of a liquid crystal material being interposed between the two panels. LCDs control the transmittance of light incident on the panels by the application of selected voltages to the field-generating electrodes so as to generate electric fields, which determine the orientation of the liquid crystal molecules in the liquid crystal layer and thereby adjust the polarization of the light incident upon the panel.

One type of LCD that is currently receiving increased attention because of its high contrast ratio and wide reference viewing angle is referred to as a "vertical alignment" (VA) mode LCD, in which, in the absence of an electric field, the molecules of the liquid crystal layer are aligned such that the long axes of the molecules are oriented perpendicular to the panels. The wide viewing angle of the VA mode LCD is achieved by cutouts or protrusions formed in or on the field-generating electrodes.

In addition to the above VA mode LCDs, in another effort to improve lateral visibility, a "domain-division" type of LCD has been developed, in which the pixel regions thereof are divided into a plurality of domains so that the orientations of the liquid crystal molecules can be determined by cutouts or protrusions that enable the inclinations of the molecules to be distributed in various directions within the pixel, thereby widening the reference viewing angle. Since the direction in which the liquid crystal molecules are inclined can be determined by the use of cut portions and protrusions, the reference viewing angle can be widened by arranging the cut portions and the protrusions in such a way as to distribute the direction of inclination of the liquid crystal molecules in an optimum manner.

However, VA mode LCDs have relatively poor lateral visibility as compared to their frontal visibility. For example, a patterned VA (PVA) mode LCD having cutouts displays an image that becomes brighter at the sides thereof, thereby resulting in poor lateral visibility. To improve lateral visibility, a method has been proposed in which each pixel of the display is divided into two sub-pixels, and one of the two sub-pixels is directly supplied with a voltage, while the other is subjected to a voltage drop by capacitive coupling, such that the two sub-pixels have different voltages applied to them. However, this method can result in a degradation of the aperture ratio of the LCD due to the capacitive coupling of the sub-pixels, and the light transmittance of the display may be decreased due to the reduction in the average voltage of each of the respective sub-pixels.

BRIEF SUMMARY

In accordance with the exemplary embodiments thereof described herein, the present invention provides LCDs having both a higher light transmittance and an enhanced lateral visibility.

In one exemplary embodiment, an LCD includes a gate line and a storage electrode line formed on a first insulating substrate, a data line insulated from and crossing the gate line, a first source electrode, at least a portion of which partially overlaps an nth gate line and is connected to the data line, first and second drain electrodes, at least a portion of which partially overlap the nth gate line and are separated from the first source electrode, a first sub-pixel electrode that is electrically connected to a first drain electrode, a second sub-pixel electrode that is electrically connected to a second drain electrode, a second source electrode, at least a portion of which partially overlaps an (n+1)th gate line and is electrically connected to the second sub-pixel electrode, and a third drain electrode, at least a portion of which partially overlaps the (n+1)th gate line and is separated from the second source electrode, and which is operable to boost a charge voltage of the first sub-pixel electrode and to drop a charge voltage of the second sub-pixel electrode.

In another exemplary embodiment, an LCD includes first and second thin film transistors controlled by an nth gate line, a third thin film transistor controlled by an (n+1)th gate line, a first sub-pixel electrode connected to an output port of the first thin film transistor, and a second sub-pixel electrode connected to an output port of the second thin film transistor and an input portion of the third thin film transistor, and in which the output port of the third thin film transistor is operable to boost a charge voltage of the first sub-pixel electrode and to drop a charge voltage of the second sub-pixel electrode.

A better understanding of the above and many other features and advantages of the novel LCDs of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

DETAILED DESCRIPTION

Figure 1:
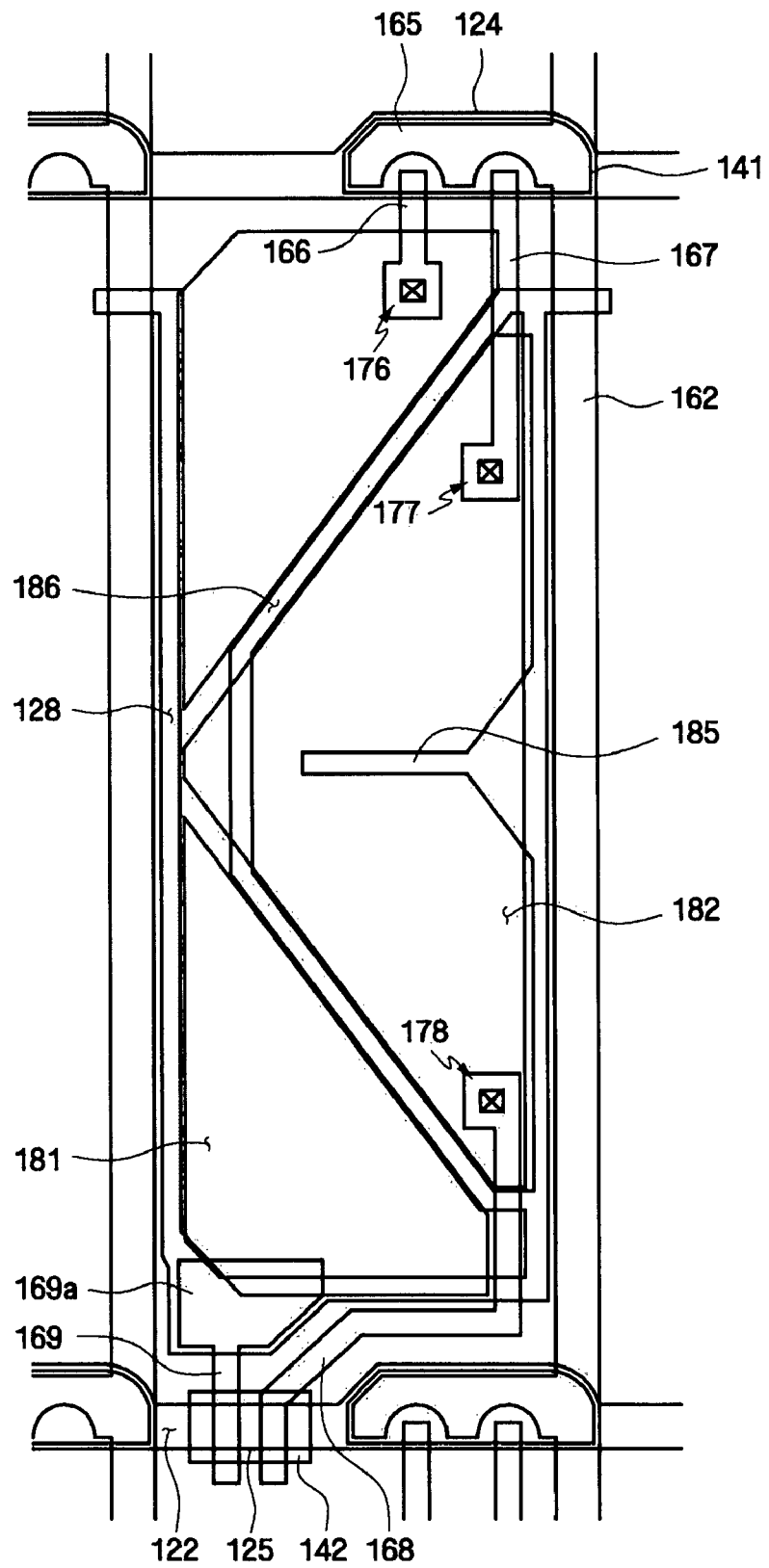
FIG. 1 is partial top plan view of a first panel of an exemplary embodiment of an LCD in accordance with the present invention, showing an exemplary single pixel area thereof.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

In the following description, it will be understood that when an element or a layer is referred to as being "on" another element or layer, it can be directly on the other element or layer, or intervening layers or elements may also be present. In contrast, when an element is referred to as being "directly on" another element, there are no intervening elements present. Like reference numerals refer to like elements throughout the specification. The terms "and/or" comprises each and at least one combination of referenced items.

Spatially relative terms, such as "below", "beneath", "lower", "above", "upper" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the figures.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. For example, while an etched region is illustrated as a rectangular shape, it may be rounded or have a predetermined curvature. Thus, regions shown in the drawings are illustrated in schematic form and the shapes of the regions are presented simply by way of illustration and not as a limitation.

An exemplary embodiment of an LCD in accordance with the present invention includes a first panel, a second panel aligned to face the first panel, and a liquid crystal layer interposed between the two panels. A plurality of pixels is defined on each panel. Each pixel of the first panel has a pixel electrode associated therewith, and a common electrode commonly associated with all of the pixels is provided on the second panel. The light transmission of the liquid crystal layer associated with each pixel is controlled by varying the strength of the electric field created between the pixel electrode and the common electrode. The configuration of the pixels in the exemplary LCD is described in greater detail below with reference to the accompanying drawings.

Figure 2:
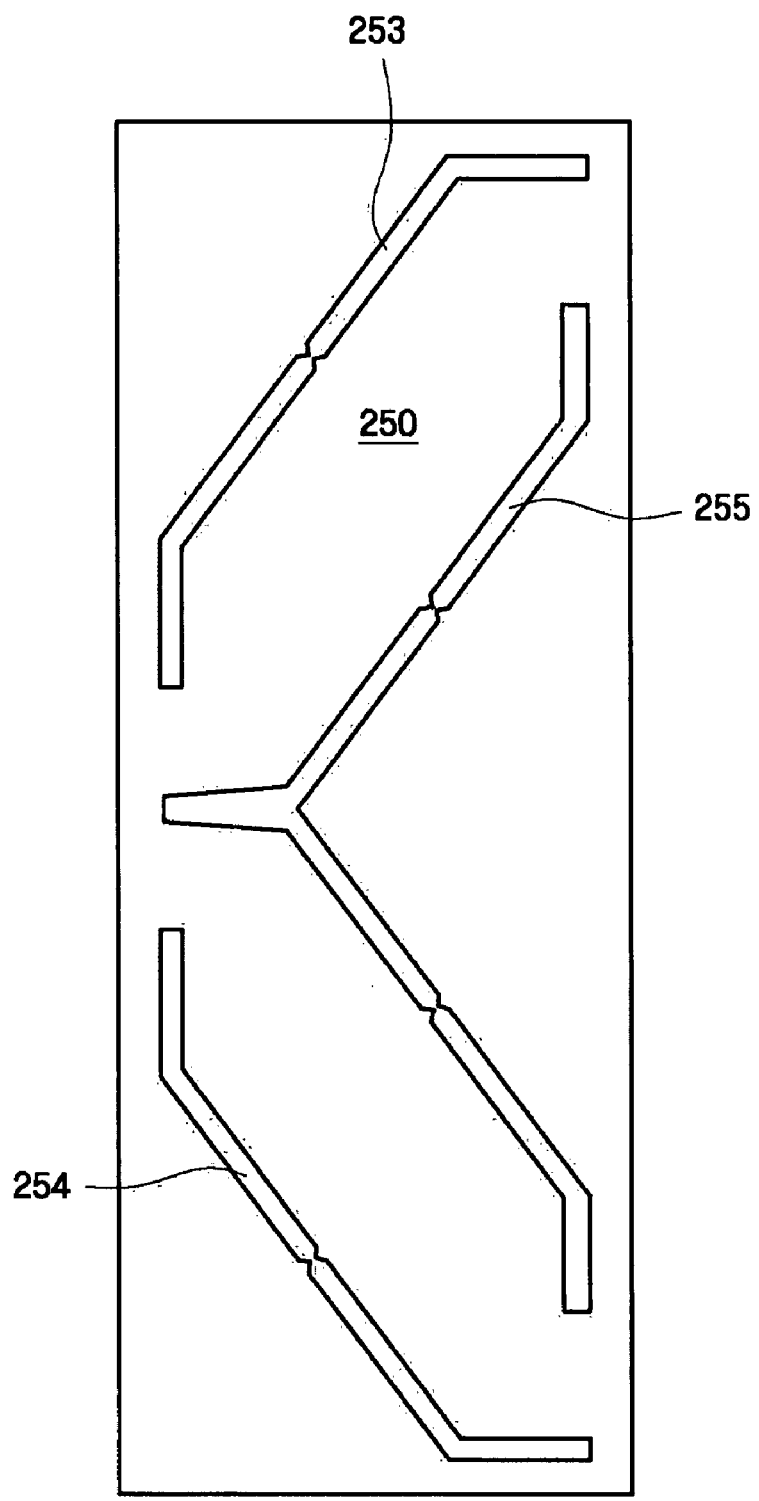
FIG. 2 is a partial top plan view of a second panel of the exemplary LCD of FIG. 1, showing an exemplary single pixel area thereof.
Figure 3:
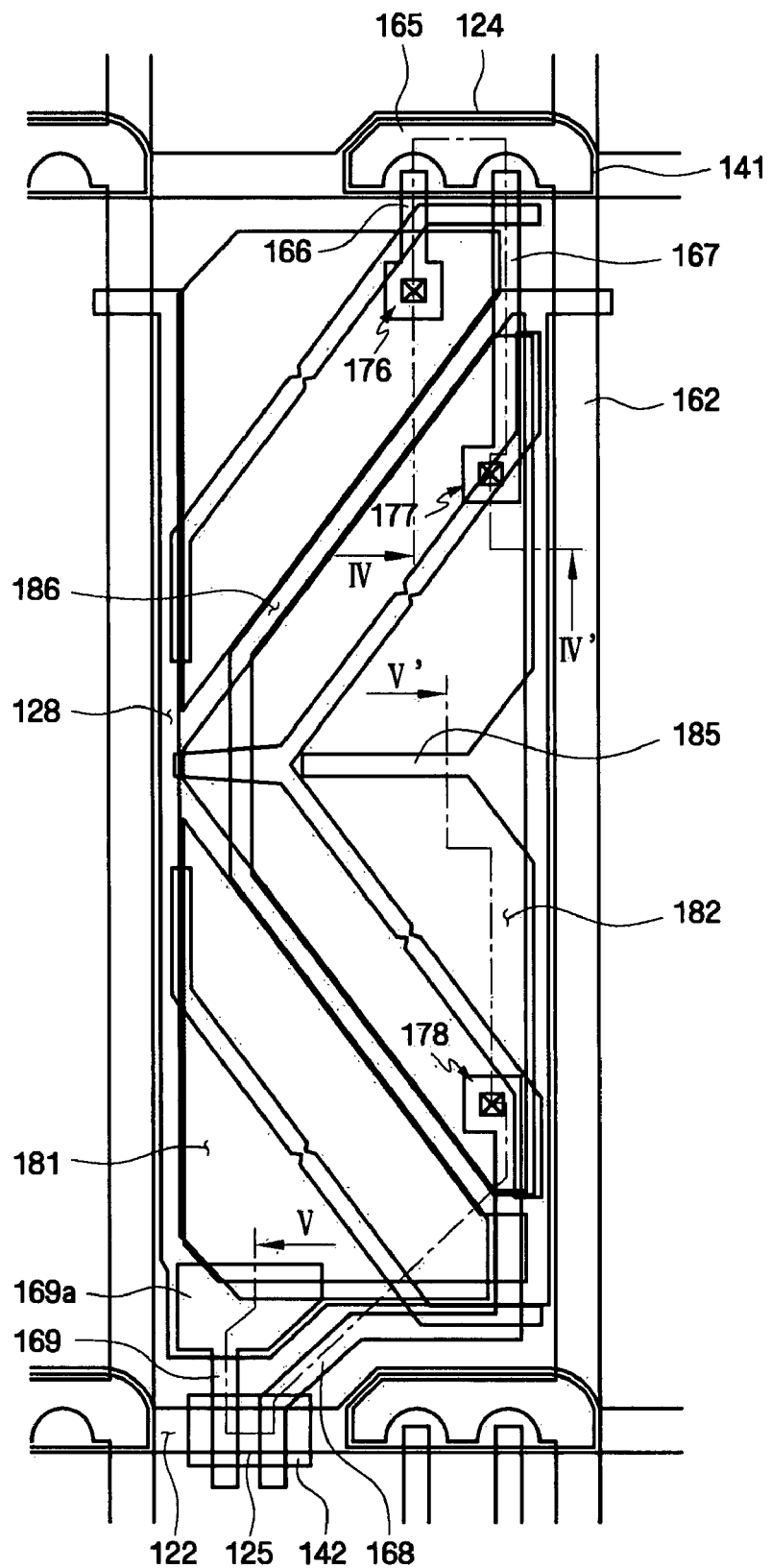
FIG. 3 is a partial top plan view of the exemplary LCD in which the respective first and second panels of FIGS. 1 and 2 are combined.
Figure 4:
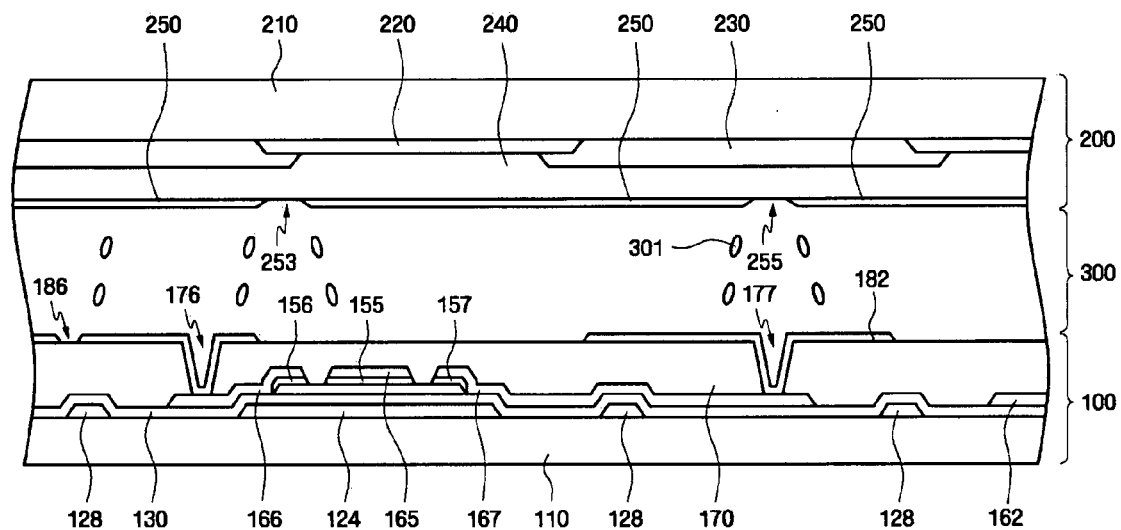
FIG. 4 is a cross-sectional view of the exemplary LCD of FIG. 3, as seen along the lines of the section IV-IV' taken therein.
Figure 5:
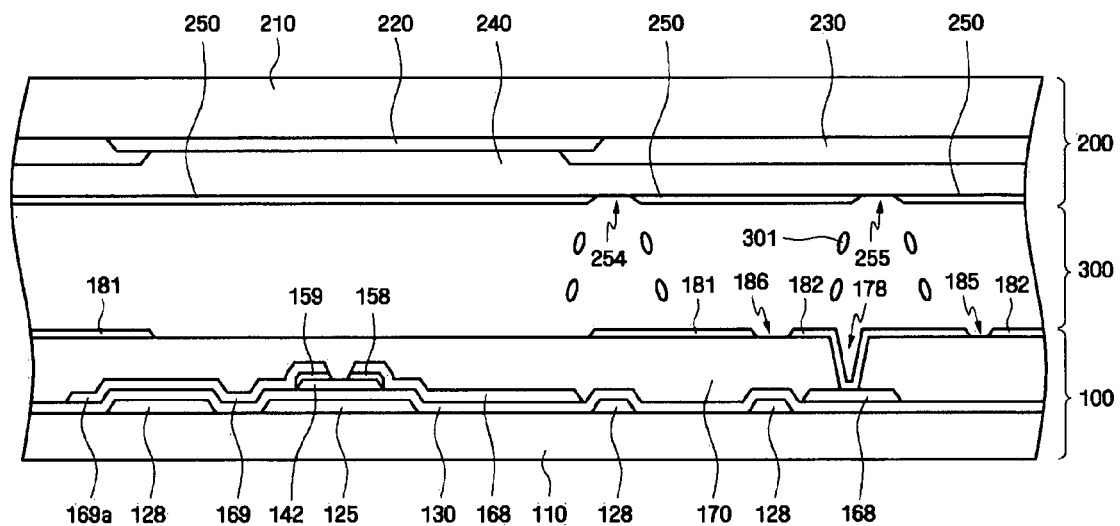
FIG. 5 is a cross-sectional view of the exemplary LCD of FIG. 3, as seen along the lines of the section V-V' taken therein.

FIG. 1 is partial top plan view of the first panel 100 of the exemplary LCD, showing an exemplary single pixel area thereof. FIG. 2 is a partial top plan view of a second panel 200 of the exemplary LCD, showing an exemplary single pixel area thereof. FIG. 3 is a partial top plan view of the exemplary LCD in which the respective first and second panels of FIGS. 1 and 2 are shown combined one on top of the other, and FIGS. 4 and 5 are cross-sectional views of the exemplary LCD of FIG. 3 as respectively seen along the lines of the section IV-IV' and V-V' taken therein.

With reference to FIGS. 1 and 3, each pixel of the first panel 100 is defined by two adjacent gate lines 122 and two adjacent data lines 162 formed on a first insulating substrate 110. The first insulating substrate 110 may comprise, for example, transparent glass or plastic. A plurality of gate lines 122 are formed on the first insulating substrate 110 and extend in a first direction thereon. The gate lines 122 include a first portion having an expanded width forming a first gate electrode 124, and a second portion forming a second gate electrode 125. The shapes of the first and second gate electrodes 124 and 125 may vary from those of the particular exemplary embodiment illustrated. For example, the first gate electrode 124 may not include an expanded portion, whereas the second gate electrode 125 may.

In the particular embodiment illustrated, for any given pixel of the panel 100, the first and second gate electrodes 124 and 125 that are connected to the same gate line 122 respectively control different pixel rows. That is, whereas, the first gate electrode 124 is connected to the nth gate line 122 and controls an nth pixel row, the second gate electrode 125 that controls the nth pixel row is connected to an (n+1)th gate line 122.

A storage electrode line 128 is formed on the first insulating substrate 110 in the same layer as the gate line 122, and the overlapping first and second sub-pixel electrodes 181 and 182 thereby form a storage capacitor. The shape and arrangement of the storage electrode line 128 may be modified from that shown in the particularly exemplary embodiment illustrated. For example, as illustrated in FIG. 1, the storage electrode line 128 may include two longitudinal portions that extend parallel with each other in the vicinity of a data line 162, an elongated portion that extends below one of the two longitudinal portions, and an oblique portion that connects the two longitudinal portions at opposite ends thereof.

A gate insulation layer 130 made of silicon nitride or silicon oxide is stacked on the gate lines 122 and the storage electrode line 128. First and second semiconductor layers 141 and 142 comprising an amorphous hydrogenated silicon are formed on the gate insulation layer 130. The first semiconductor layer 141 overlaps the first gate electrode 124 and the second semiconductor layer 142 overlaps the second gate electrode 125.

A data wire (162, 165, 166, 167, 168, and 169) is formed on the first and second semiconductor layers 141 and 142. The data wire (162, 165, 166, 167, 168, and 169) includes the data line 162 extending in a second direction perpendicular to the first direction, a first source electrode 165 branching from the data line 162, first and second drain electrodes 166 and 167 separated from the first source electrode 165 and located opposite to each other, a second source electrode 168 extending from the upper portion of the first source electrode 165 to a pixel region, and a third drain electrode 169 separated from and located opposite to the second source electrode 168. The first source electrode 165 and the first and second drain electrodes 166 and 167 have at least some portions that partially overlap the first gate electrode 124, while the second source electrode 168 and the third drain electrode 169 have at least some portions that partially overlap the second gate electrode 125. Ohmic contact layers 152, 155, 156, 157, 158 and 159, made of, for example, silicide or n+ amorphous silicon hydride in which an n-type impurity is highly doped, are formed between each of the first and second semiconductor layers 141 and 142 and each of the data wires (162, 165, 166, 167, 168, and 169).

In the particular embodiment illustrated, the third drain electrode 169 overlaps the storage electrode line 128, and may further include a portion 169a having an expanded width. The expanded portion 169a of the third electrode 169 partially overlaps not only the storage electrode line 128, but also the first sub-pixel electrode 181 that is described below. The expanded portion 169a and the storage electrode line 128 overlapping the third drain electrode 169 constitute a voltage-dropping capacitor that functions to drop the absolute value of the pixel voltage charged in the second sub-pixel electrode 182, in the manner described in more detail below. The expanded portion 169a and first sub-pixel electrode 181 overlapping therewith constitute a voltage-boosting capacitor that functions to boost the absolute value of a pixel voltage of the first sub-pixel electrode 181 in the manner described below. Thus, even though a data voltage of the same level is applied to the first and second sub-pixel electrodes 181 and 182, the charge voltages of the first and second sub-pixel electrodes 181 and 182 can be adjusted to have different values, as described in more detail below.

The first gate electrode 124, the first source electrode 165, and the first drain electrode 166 form a first thin film transistor (TFT) having the first semiconductor layer 141 as the channel thereof. The first gate electrode 124, the first source electrode 165, and the second drain electrode 167 form a second TFT having the first semiconductor layer 141 as the channel thereof. The second gate electrode 125, the second source electrode 168, and the third drain electrode 169 form a third TFT having the second semiconductor layer 142 as the channel thereof. As described above, the second gate electrode 125 connected to the third TFT for driving the same pixel region is connected to the next-adjacent gate line 122 to the gate line 122 to which the first gate electrode 124 is connected.

A passivation layer 170 is formed on the data wire (162, 165, 166, 167, 168, and 169). The passivation layer 170 may comprise an inorganic insulator material, such as silicon nitride (SiNx), or alternatively, an organic insulator material. In yet another alternative, the passivation layer 170 may comprise a stacked structure having two or more layers, including an inorganic insulator material and an organic insulator material. The passivation layer 170 includes contact holes 176, 177 and 178 that expose at least some parts of the first and second drain electrodes 166 and 167 and the second source electrode 168.

Pixel electrodes, made of transparent conductive materials, are formed on the data wire (162, 165, 166, 167, 168, and 169). The pixel electrodes include first and second sub pixel electrodes 181 and 182 that are separated from each other by a partitioning member 186. The first sub pixel electrode 181 is connected to the first drain electrode 167 through the contact hole 176, and overlaps a longitudinal portion of the storage electrode line 128 at one side thereof and the expanded portion thereof.

The second sub pixel electrode 182 is connected to the second drain electrode 167 and the second source electrode 168 through the contact holes 177 and 178, and overlaps a longitudinal portion at the other side of the storage electrode line 128. A cutout portion 185 is recessed at the center of the second sub pixel electrode 182. In addition, the first and second sub pixel electrodes 181 and 182 are separated from each other with respect to an oblique portion of the storage electrode line 128. In other words, the oblique portion of the storage electrode line 128 overlaps the partitioning member 186 that separates the first and second sub pixel electrodes 181 and 182 from each other. The cutout portion 185 and the partitioning member 186 induce fringe fields that define domains, within each of which the liquid crystal material exhibits a uniform behavior.

Although not illustrated in the figure, an alignment film may also be provided on the pixel electrodes. The alignment film may comprise, for example, a vertical alignment film.

As those of skill in the art will appreciate, although the same data voltage is applied to the first and second sub-pixel electrodes 181 and 182, the first sub pixel electrode 181 will be charged with a pixel voltage that has an absolute value which is greater than that of the data voltage applied, as the result of the coupling of a voltage-boosting capacitor thereto, whereas. the second sub pixel electrode 182 will be charged with a pixel voltage that has an absolute value that is less than that of the applied data voltage, as the result of the coupling thereto of a voltage-dropping capacitor. In other words, sub pixel electrodes of the same pixel electrode are charged with different voltages, thereby improving the lateral visibility of the display by preventing distortion in the gamma curve thereof. In the particular exemplary embodiment illustrated, since the voltage charged in the second sub pixel electrode 182 increases and the voltage charged in the first sub pixel electrode 181 decreases, the difference between the voltages charged in the first and second sub pixel electrodes 181 and 182 increases. Therefore, even a capacitor having a relatively small capacitance can produce a sufficient voltage difference, as compared to the case in which only a voltage-dropping capacitor is provided. This suggests that an area of the third drain electrode 169 forming either a voltage-boosting or voltage-dropping capacitor can be reduced, thereby advantageously achieving an improved aspect ratio. Additionally, since the voltage is boosted, the transmittance of the pixel, and hence, of the display, is also enhanced.

The second panel 200 of the exemplary LCD is described in further detail below with reference to FIGS. 2 and 3-5. Like the first insulating substrate 110, the second panel 200 comprises a second insulating substrate 210, which may comprise transparent glass or plastic. A black matrix 220 is formed on the second insulating substrate 210. The black matrix 220 overlaps the gate line 122 and the data line 162 of the first panel 100. A color filter 230 is formed in an area outlined by the black matrix 220. The color filter 230 is aligned so as to overlap the first and second sub pixel electrodes 181 and 182 of the first panel 100 when the two panels are sandwiched together.

An overcoat layer 240 is formed over the black matrix 220 and the color filter 230 to planarize the stepped surfaces thereof.

A common electrode 250, made of a transparent conductive material, such as ITO or IZO, is formed on the overcoat layer 240. The common electrode 250 is formed over the entire surface of the second panel 200, and has a plurality of cutouts for each pixel. For example, three cutouts 253, 254 and 255 may be provided for each pixel, as shown in FIG. 2. More specifically, the two cutouts 253 and 254 are formed so as to overlap the first sub pixel electrode 181 of the first panel 100, to extend in opposite directions parallel to the oblique portions of the storage electrode line 128, and to bend at the edges of the first and second sub pixel electrodes 181 and 182 so as to be parallel with the gate line 122 or the data line 162. The cutouts 253 and 254 are not connected with each other at the center of the pixel region. The cutout 255 is formed so as to overlap the second sub pixel electrode 182 of the first panel 100, to extends in opposite directions parallel with the oblique portions of the storage electrode line 128, and to bend so as to be parallel with the gate line 122. The portions of the cutout 255 that extend in opposite directions are combined with each other at the center of the pixel region. The cutouts 253, 254 and 255, together with the partitioning member 186 and the cutout portion 185 of the second sub pixel electrode 182, are operable to induce fringe fields that define domains, within each of which the liquid crystal material exhibits a uniform behavior.

Although not illustrated in the figure, an alignment film may further be provided on the common electrode 250. The alignment film may comprise, for example, a vertical alignment film.

Referring to FIGS. 4 and 5, a liquid crystal layer 300, including multiple liquid crystal molecules 301, is interposed between the first and second panels 100 and 200. In a voltage-off state, i.e., in the absence of an electric field, the liquid crystal molecules 310 are aligned vertically with respect to the electric field in accordance with the properties of an alignment film provided in the LCD. However, when a voltage of a selected value is applied between the pixel electrodes (181 and 182) of the first panel 100 and the common electrode 250 of the second panel 200, an electric field is imposed on the liquid crystal layer 300 in the area of the pixel, so that the liquid crystal molecules 310 rotate a selected amount in a selected direction. If the liquid crystal molecules 310 have a negative dielectric anisotropy, they rotate in a direction perpendicular to the electric field. If the liquid crystal molecules 310 have a positive dielectric anisotropy, they rotate in a direction parallel to the electric field. Transmittance of light through the liquid crystal layer 300 is determined by the amount of rotation of the liquid crystal molecules 310. One or more polarizers (not illustrated) are attached to the exterior side(s) of the first panel 100 and/or the second panel 200, thereby controlling the overall transmittance of the LCD. In the exemplary LCD embodiment described above, since fringe fields are created by the cutout 185 and the partitioning member 186 provided in the first panel 100, and by the cutouts 253, 254 and 255 provided in the second panel 200, the liquid crystal molecules 310 rotate in specific directions in each of the multiple domains. Therefore, a display panel with a wide viewing angle is achieved, the occurrence of textures due to collision of the liquid crystal molecules 310 is prevented, and the speed of rotation of the liquid crystal molecules 310, that is, their response speed to an electric field, is increased.

Figure 6:
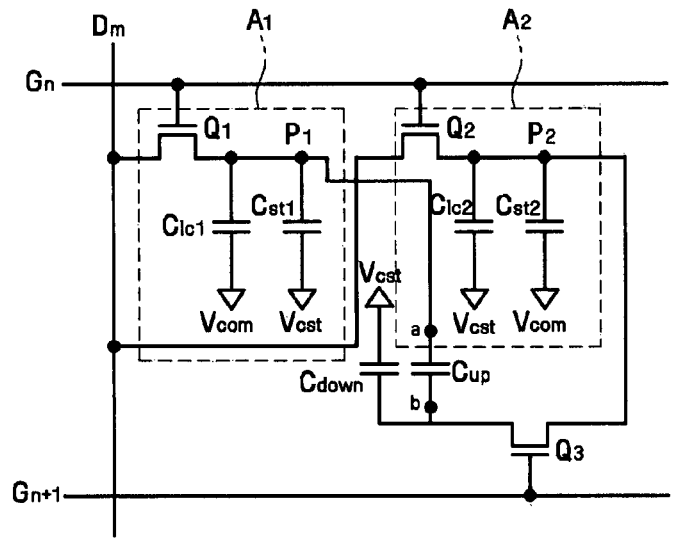
FIG. 6 is a schematic circuit diagram of the exemplary LCD.
Figure 7:
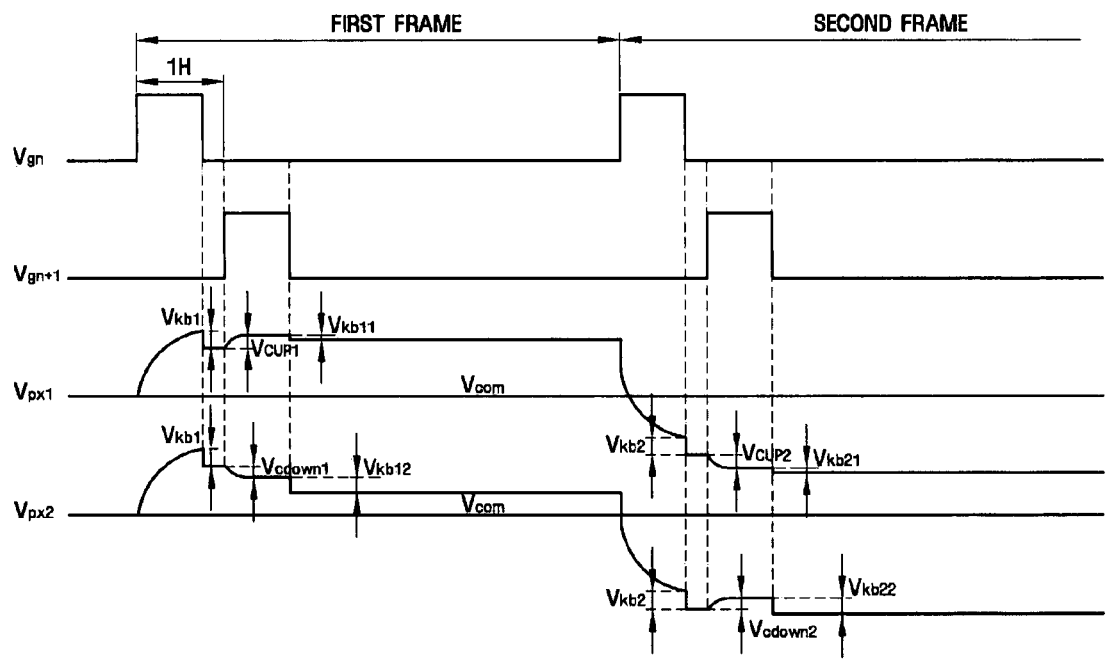
FIG. 7 is a diagram illustrating the waveform of voltages applied to the exemplary LCD of FIG. 6.

Following is a detailed description of the operation of the above LCD in connection with FIG. 6, which is a schematic circuit diagram of a single exemplary pixel area of the LCD of FIGS. 3, 4 and 5, and in which the pixel area illustrated is positioned between an nth gate line and an (n+1)th gate line. In FIG. 6, "A1" indicates a first sub pixel electrode area, and "A2" indicates a second sub pixel electrode area. FIG. 7 is a diagram illustrating the respective waveforms of various voltages applied to the LCD of FIG. 6. As may be seen in FIG. 7, data voltages that are inverted with respect to a common voltage are applied to the gate lines for the time periods corresponding to the duration of the respective consecutive frames indicated therein.

For convenience of explanation, it is assumed that a common voltage Vcom of 5 V is supplied to a storage electrode line and a common electrode, a data voltage of 7 V is applied for a time period corresponding to the duration of the first frame, and a data voltage of 3 V is applied for a time period corresponding to the duration of the second frame. When the 7 V data voltage of 7 V is applied to a data line Dm, a gate-on signal is applied to the nth gate line Gn, and first and second TFTs Q1 and Q2 are consequently turned on so that the data voltage is thereby applied to the first and second sub pixel electrode areas A1 and A2. The first and second sub pixel electrode areas A1 and A2 are connected to the same data line Dm, and therefore, the amplitudes of the voltages applied to a terminal P1 positioned in the first sub pixel electrode area A1 and a terminal P2 positioned in the second sub pixel electrode area A2 are the same as each other. In other words, while the gate-on signal is being applied to the nth gate line Gn, the sub pixel voltages Vpx1 and Vpx2 derived from the 7 V are respectively supplied to the terminals P1 and P2.

In the particular exemplary embodiment illustrated, a first liquid crystal capacitor Clc1, a first storage capacitor Cst1, a second liquid crystal capacitor Clc2, and a second storage capacitor Cst2 are charged with a voltage of 2 V, i.e., the difference between each of the sub pixel voltages Vpx1 and Vpx2 and the common voltage Vcom. Meanwhile, a voltage of 7 V is applied to a terminal labeled "a" connected to the terminal P1, and inversion driving is thereby performed for the duration of each frame. Thus, assuming that a voltage of approximately 3 V is applied to a terminal labeled "b" for a time period corresponding to the duration of the previous frame, a voltage of approximately 4 V is charged in a voltage-boosting capacitor Cup provided between the terminals a and b, while a voltage of approximately 2 V is charged in a voltage-dropping capacitor, Cdown.

If a gate-off voltage is then applied to the nth gate line Gn, the first TFT Q1 and the second TFT Q2 are thereby turned off, and the voltage charged in the first sub pixel electrode area A1 and the second sub pixel electrode area A2 is reduced by a first "kickback" voltage, labeled "Vkb1," for the first frame After a lapse of one horizontal period (1H) from the time at which the gate-on signal is applied to the nth gate line Gn, the gate-on signal is applied to the (n+1)th gate line Gn+1, so that a third TFT Q3 connected to the (n+1)th gate line Gn+1 is turned on. When the third TFT Q3 is turned on, the terminal P2 and the terminal b are electrically connected to each other, so that a voltage of 7 V is supplied to the terminal b. Since approximately 4 V is charged in the voltage-boosting capacitor Cup, the voltage of the terminal P2 rises instantaneously. Meanwhile, since approximately 2 V is charged in the voltage-dropping capacitor Cdown and one end of the voltage-dropping capacitor Cdown is connected to the storage electrode line, the voltage of the terminal b falls instantaneously. Accordingly, the voltage charged in the first sub pixel electrode area A1 is instantaneously increased by the coupling thereto of the voltage-boosting capacitor Cup (i.e., Vcup1 of FIG. 7), and the voltage charged in the second sub pixel electrode area A2 is instantaneously decreased by the coupling thereto of the voltage-dropping capacitor Cdown (Vcdown1 of FIG. 7).

If a gate-off voltage is then applied to the (n+1)th gate line Gn+1, the voltage charged in the first sub pixel electrode area A1 decreases slightly by a second kickback voltage, labeled "Vkb11," for the first frame, and the voltage charged in the second sub pixel electrode area A2 is further decreased by a third kickback voltage, labeled "Vkb12," for the first frame. For the time period corresponding to the duration of the first frame, the first sub pixel electrode area A1 and the second sub pixel electrode area A2 are maintained at the voltages Vpx1 and Vpx2 respectively charged therein.

Thus, as described above, while the same voltage is applied to the first and second sub-pixel electrode areas A1 and A2 for a time period corresponding to the duration of the first frame, the voltage Vpx1 charged in the first sub pixel electrode area A1 is increased, and the voltage Vpx2 charged in the second sub pixel electrode area A2 is decreased, and accordingly, a higher voltage can be charged in the first sub pixel electrode area A1 than in the second sub pixel electrode area A2. That is, the absolute value of the voltage charged in the first liquid crystal capacitor Clc1 and the first storage capacitor Cst1 provided in the first sub pixel electrode area A1 is larger than the absolute value of the voltage charged in the second liquid crystal capacitor Clc2 and the second storage capacitor Cst2 provided in the second sub pixel electrode area A2.

The voltages charged in the respective sub pixel electrodes during the second frame are described next in conjunction with FIGS. 6 and 7.

When a data voltage of 3 V is applied to the data line Dm, if a gate-on signal is applied to the nth gate line Gn for the second frame, the first and second TFTs Q1 and Q2 are turned on so that the data voltage is applied to the first and second sub pixel electrode areas A1 and A2. While the gate-on signal is being applied to the nth gate line Gn, sub pixel voltages Vpx1 and Vpx2 derived from the 3 V are supplied to the terminals P1 and P2. Here, the first liquid crystal capacitor Clc1, the first storage capacitor Cst1, the second liquid crystal capacitor Clc2, and the second storage capacitor Cst2 are charged with a voltage of −2 V, i.e., the difference between each of the sub pixel voltages Vpx1 and Vpx2 and the common voltage Vcom. Meanwhile, a voltage of 3 V is applied to the terminal "a" connected to the terminal P1 and inversion driving is thereby performed for a time period corresponding to the duration of each frame. Thus, assuming a voltage of approximately 3 V is applied to the terminal b for the time period corresponding to the duration of the previous frame, a voltage of approximately −4 V is charged in a voltage-boosting capacitor Cup provided between the terminals a and b, while a voltage of approximately −2 V is charged in a voltage-dropping capacitor, Cdown.

Next, if a gate-off voltage is then applied to the nth gate line Gn, the first TFT Q1 and the second TFT Q2 are turned off, and the voltage charged in the first sub pixel electrode area A1 and the second sub pixel electrode area A2 is reduced by a first kickback voltage, labeled "Vkb2," for the second frame.

After a lapse of one horizontal period (1H) from the time at which the gate-on signal is applied to the nth gate line Gn, the gate-on signal is applied to the (n+1)th gate line Gn+1, so that the third TFT Q3 connected to the (n+1)th gate line Gn+1 is turned on. When the third TFT Q3 is turned on, the terminal P2 and the terminal b are electrically connected to each other so that a voltage of 3 V is supplied to the terminal b. Since approximately −4 V is charged in the voltage-boosting capacitor Cup, the voltage of the terminal P1 rises instantaneously. Meanwhile, since approximately −2 V is charged in the voltage-dropping capacitor Cdown, and one end of the voltage-dropping capacitor Cdown is connected to the storage electrode line, the voltage of the terminal b rises instantaneously. Accordingly, the voltage charged in the first sub pixel electrode area A1 is instantaneously increased by the coupling thereto of the voltage-boosting capacitor Cup (i.e., Vcup2 of FIG. 7), and the voltage charged in the second sub pixel electrode area A2 is instantaneously decreased by the coupling thereto of the voltage-dropping capacitor, Cdown (Vcdown2 of FIG. 7).

If a gate-off voltage is then applied to the (n+1)th gate line Gn+1, the voltage charged in the first sub pixel electrode area A1 is decrease slightly by a second kickback voltage, Vkb21, for the second frame, and the voltage charged in the second sub pixel electrode area A2 is further decreased by a third kickback voltage, Vkb22, for the second frame. Thus, for a time period corresponding to the duration of the first frame, the first sub pixel electrode area A1 and the second sub pixel electrode area A2 are maintained at the voltages of Vpx1 and Vpx2 respectively charged therein.

As described above, while the same voltage is thus applied to the first and second sub-pixel electrode areas A1 and A2 for a time period corresponding to the duration of the second frame, the voltage charged in the first sub pixel electrode area A1 is decreased, and the voltage charged in the second sub pixel electrode area A2 is increased, and accordingly, a lower voltage is charged in the first sub pixel electrode area A1 than in the second sub pixel electrode area A2. That is, as during the first frame, the absolute value of the voltage charged in the first liquid crystal capacitor Clc1 and the first storage capacitor Cst1 in the first sub pixel electrode area A1 is larger than the absolute value of the voltage charged in the second liquid crystal capacitor Clc2 and the second storage capacitor Cst2 in the second sub pixel electrode area A2.

As described above, in the exemplary LCD of the present invention, the absolute value of the voltage charged in the first liquid crystal capacitor Clc1 and the first storage capacitor Cst1 in the first sub pixel electrode area A1 is larger than the absolute value of the voltage charged in the second liquid crystal capacitor Clc2 and the second storage capacitor Cst2 in the second sub pixel electrode area A2, irrespective of the frame. Therefore, even if the same data voltage is applied to the first sub pixel electrode area A1 and the second sub pixel electrode area A2, different voltages are respectively charged therein, thereby preventing distortion in the gamma curve. Further, according to the present invention, since the magnitude of the absolute value of the voltage charged in the first pixel electrode area A1 is made to increase while the magnitude of the absolute value of the voltage charged in the second pixel electrode area A2 is made to decrease, the difference between the voltages charged in the first sub pixel electrode area A1 and the second sub pixel electrode area A2 is increased with respect to the same data voltage applied thereto.

Therefore, the magnitude of the data voltage applied to provide the same luminance is reduced, which is advantageous in achieving an improved display aspect ratio. Further, since the magnitude of the pixel voltage charged in a pixel electrode with the same data voltage applied thereto is increased, the light transmittance of the display is enhanced. According to the exemplary LCDs of the present invention described herein, the use of capacitors enables the absolute value of the voltage charged in a second sub pixel electrode to be reduced and the absolute value of a voltage charged in a first sub pixel electrode to be increased, so that the difference between the voltages charged in the first and second sub pixel electrodes is increased. As a result, the light transmittance of the LCD is increased and its lateral visibility is improved.

By now, those of skill in this art will appreciate that many modifications, substitutions and variations can be made in and to LCDs of this invention without departing from its spirit and scope. In light of this, the scope of the present invention should not be limited to that of the particular embodiments illustrated and described herein, as they are only exemplary in nature, but instead, should be fully commensurate with that of the claims appended hereafter and their functional equivalents.

What is claimed is:

1. A liquid crystal display (LCD), comprising:
   a gate line and a storage electrode line formed on a first insulating substrate;
   a data line insulated from and crossing the gate line;
   a first source electrode electrically connected to the data line, at least a portion of which partially overlaps an nth gate line;
   first and second drain electrodes, at least a portion of which partially overlap the nth gate line and which are separated from the first source electrode;

a first sub-pixel electrode electrically connected to a first drain electrode;

a second sub-pixel electrode electrically connected to a second drain electrode;

a second source electrode electrically connected to the second sub-pixel electrode, at least a portion of which partially overlaps an (n+1)th gate line; and, a third drain electrode, at least a portion of which partially overlaps the (n+1)th gate line, and which is separated from the second source electrode and operable to boost a charge voltage of the first sub-pixel electrode and to drop a charge voltage of the second sub-pixel electrode.

2. The LCD of claim 1, wherein the third drain electrode at least partially overlaps the first sub-pixel electrode.

3. The LCD of claim 2, wherein an area of overlap of the third drain electrode and the first sub-pixel electrode forms a voltage-boosting capacitor operable to boost a charge voltage of the first sub-pixel electrode.

4. The LCD of claim 2, wherein the third drain electrode at least partially overlaps the storage electrode line.

5. The LCD of claim 4, wherein an area of overlap of the third drain electrode and the storage electrode line forms a voltage-dropping capacitor operable to drop a charge voltage of the second sub-pixel electrode.

6. The LCD of claim 1, wherein the data line provides the first and second sub-pixel electrodes with the same charge voltage.

7. The LCD of claim 1, wherein at least a portion of the storage electrode line overlaps a partitioning member separating the first and second sub-pixel electrodes from each other.

8. The LCD of claim 1, further comprising:

a second insulating substrate facing the first insulating substrate;

a common electrode formed on the second insulating substrate; and, a layer of a liquid crystal material interposed between the first and second substrates.

9. The LCD of claim 8, wherein the common electrode includes a cut portion that is substantially parallel to a partitioning member separating the first and second sub-pixel electrodes from each other, and wherein the partitioning member and the cut portion divide the liquid crystal layer into a plurality of domains.

10. A liquid crystal display (LCD), comprising:

first and second thin film transistors controlled by an nth gate line;

a third thin film transistor controlled by an (n+1)th gate line;

a first sub-pixel electrode connected to an output port of the first thin film transistor; and, a second sub-pixel electrode connected to an output port of the second thin film transistor and an input portion of the third thin film transistor, wherein the output port of the third thin film transistor is operable to boost a charge voltage of the first sub-pixel electrode and to drop a charge voltage of the second sub-pixel electrode.

11. The LCD of claim 10, wherein a capacitor operable to boost the charge voltage of the first sub-pixel electrode is formed between an output port of the third thin film transistor and the first sub-pixel electrode.

12. The LCD of claim 11, further comprising a storage electrode line overlapping the first and second sub-pixel electrodes and thereby forming a storage capacitor, and wherein a capacitor operable to drop the charge voltage of the second sub-pixel electrode is formed between an output port of the third thin film transistor and the storage electrode line.

13. The LCD of claim 10, wherein input ports of the first and second thin film transistors are connected to the same data line, and wherein the same charge voltage is applied to the first and second sub-pixel electrodes when the first and second thin film transistors are turned on.

* * * * *

UNITED STATES PATENT AND TRADEMARK OFFICE
CERTIFICATE OF CORRECTION

PATENT NO. : 7,532,269 B2
APPLICATION NO. : 11/726984
DATED : May 12, 2009
INVENTOR(S) : Soon-il Ahn It is certified that error appears in the above-identified patent and that said Letters Patent is hereby corrected as shown below:

On the Title of the patent, no. (73):

it should read: Samsung Electronics, Co., Ltd.,
Gyeonggi-do (KR)

instead of -- Sansung Electronics, Co., Ltd.,
Gyeonggi-do (KR) -- please note that the Assignee's name is Samsung Electronics, Co., Ltd. with "m" not Sansung Electronics, Co., Ltd., with "n".

Signed and Sealed this

Thirtieth Day of June, 2009

JOHN DOLL
*Acting Director of the United States Patent and Trademark Office*